United States Patent
Wang et al.

(10) Patent No.: US 12,537,282 B2
(45) Date of Patent: Jan. 27, 2026

(54) UNIVERSAL MOUNT FOR REMOTE RADIO UNITS AND RELATED ASSEMBLIES

(71) Applicant: Outdoor Wireless Networks LLC, Claremont, NC (US)

(72) Inventors: Jiayong Wang, Suzhou (CN); ZhaoHui Liu, Suzhou (CN); Charles John Mann, Omaha, NE (US); Jared D. Haines, Rock City Falls, NY (US)

(73) Assignee: OUTDOOR WIRELESS NETWORKS LLC, Richardson, TX (US)

( * ) Notice: Subject to any disclaimer, the term of this patent is extended or adjusted under 35 U.S.C. 154(b) by 80 days.

(21) Appl. No.: 18/441,427

(22) Filed: Feb. 14, 2024

(65) Prior Publication Data
US 2024/0283125 A1 Aug. 22, 2024

(30) Foreign Application Priority Data
Feb. 17, 2023 (CN) .......................... 202310134548.4

(51) Int. Cl.
*H01Q 1/12* (2006.01)
*H05K 5/02* (2006.01)

(52) U.S. Cl.
CPC ......... *H01Q 1/1228* (2013.01); *H05K 5/0217* (2013.01)

(58) Field of Classification Search
CPC ....... H01Q 1/1228; H01Q 1/12; H05K 5/0217
See application file for complete search history.

(56) References Cited

U.S. PATENT DOCUMENTS

| | | | |
|---|---|---|---|
| 11,817,615 B2* | 11/2023 | Campbell | H01Q 1/1228 |
| 2014/0179244 A1* | 6/2014 | Colapietro | H01Q 1/246 |
| | | | 455/90.2 |
| 2016/0153609 A1* | 6/2016 | Ortel | A47B 81/06 |
| | | | 211/26 |
| 2016/0261030 A1* | 9/2016 | Kim | H01Q 1/1264 |
| 2017/0264005 A1* | 9/2017 | Roy | H01Q 1/246 |

* cited by examiner

*Primary Examiner* — Hai V Tran
(74) *Attorney, Agent, or Firm* — Myers Bigel, P.A.

(57) ABSTRACT

The present application is directed to an assembly for mounting remote radio units to a mounting structure. The assembly includes an upper mounting assembly and a lower mounting assembly. The upper mounting assembly includes a first support member coupled to a first clamp assembly configured to be secured to the mounting structure, and a pair of upper hanger plates configured to engage and be secured to the first support member. The lower mounting assembly includes a second support member coupled to a second clamp assembly configured to be secured to the mounting structure a distance from the first clamp assembly, and a pair of lower hanger plates configured to engage and be secured to the second support member. Corresponding upper and lower hanger plates are configured to have a respective remote radio unit mounted thereto.

20 Claims, 9 Drawing Sheets

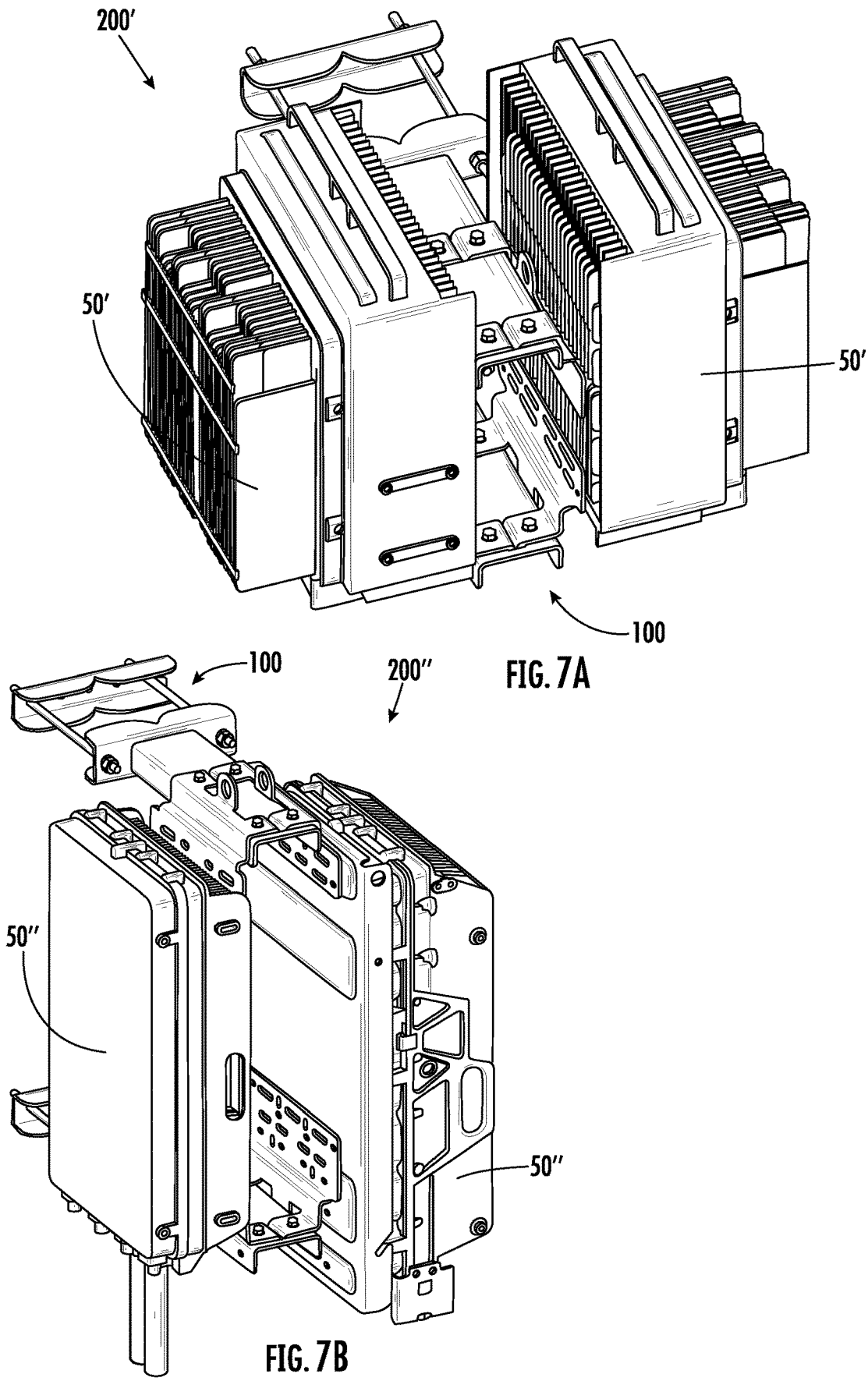

UNIVERSAL MOUNT FOR REMOTE RADIO UNITS AND RELATED ASSEMBLIES

RELATED APPLICATION(S)

The present application claims priority from and the benefit of Chinese Patent Application No. 202310134548.4, filed Feb. 17, 2023, the disclosure of which is hereby incorporated herein in its entirety.

FIELD

The present invention relates to telecommunications equipment, and in particular, to the mounts for remote radio units.

BACKGROUND

With increased demand for more wireless communication, the number of radio and antenna units that a tower traditionally supports has increased and is expected to continue to increase. New towers will need to be designed to support greater numbers of antenna and radio units, while existing towers are retrofitted to support more units, and effort is made to fully utilize space available on the towers.

Often, remote radio units (RRUs) are mounted on legs of antenna towers. In some instances, it may be desirable to mount two RRUs on a single mounting location. It also may be desirable to mount a complimentary module adjacent the RRUs.

SUMMARY

A first aspect of the present invention is directed to an assembly for mounting one or more remote radio units to a mounting structure. The assembly includes an upper mounting bracket assembly and a lower mounting bracket assembly. The upper mounting bracket assembly includes a first main support member coupled to a first clamp assembly, the first clamp assembly configured to be secured to the mounting structure, and a pair of upper hanger plates, each upper hanger plate being configured to engage and be secured to the first main support member. The lower mounting bracket assembly includes a second main support member coupled to a second clamp assembly, the second clamp assembly configured to be secured to the mounting structure a distance from the first clamp assembly, and a pair of lower hanger plates, each lower hanger plate being configured to engage and be secured to the second main support member. One of the upper hanger plates and one of the lower hanger plates are configured to have a first remote radio unit mounted and secured thereto, and the other upper hanger plate and lower hanger plate are configured to configured to have a second remote radio unit mounted and secured thereto.

Another aspect of the present invention is directed to a remote radio unit mount assembly system. The system includes a first remote radio unit, a second remote radio unit, and a remote radio unit mount assembly. The mount assembly includes an upper mounting bracket assembly and a lower mounting bracket assembly. The upper mounting bracket assembly includes a first main support member coupled to a first clamp assembly, the first clamp assembly configured to be secured to the mounting structure, and a pair of upper hanger plates, each upper hanger plate being configured to engage and be secured to the first main support member. The lower mounting bracket assembly includes a second main support member coupled to a second clamp assembly, the second clamp assembly configured to be secured to the mounting structure a distance from the first clamp assembly, and a pair of lower hanger plates, each lower hanger plate being configured to engage and be secured to the second main support member. The first remote radio unit is mounted and secured to one of the upper hanger plates and one of the lower hanger plates, and the second remote radio unit is mounted and secured to the other upper hanger plate and lower hanger plate Another aspect of the present invention is directed to an assembly for mounting one or more remote radio units to a mounting structure. The assembly includes an upper mounting bracket assembly and a lower mounting bracket assembly. The upper mounting bracket assembly includes a first main support member coupled to a first clamp assembly, the first clamp assembly configured to be secured to the mounting structure, and a pair of upper hanger plates, each upper hanger plate being configured to engage and be secured to the first main support member. Each of the upper hanger plates include a main body having a plurality of apertures, each aperture configured to receive a respective fastener to secure the first or second remote radio unit thereto, a mounting section coupled to and extending upwardly from the main body, the mounting section including a pair of hooking members extending outwardly and generally perpendicularly from the mounting section, each of the hooking members having a flanged edge configured to engage with the first main support member, and an eyelet coupled to and extending upwardly from the mounting section. The lower mounting bracket assembly includes a second main support member coupled to a second clamp assembly, the second clamp assembly configured to be secured to the mounting structure a distance from the first clamp assembly, and a pair of lower hanger plates, each lower hanger plate being configured to engage and be secured to the second main support member. Each of the lower hanger plates include a main body having a plurality of apertures, each aperture configured to receive a respective fastener to secure the first or second remote radio unit thereto, a mounting section coupled to and extending downwardly from the main body, the mounting section including a pair of hooking members extending outwardly and generally perpendicularly from the mounting section, each of the hooking members having a flanged edge configured to engage with the second main support member, and a support member coupled to and extending downwardly from the mounting section. One of the upper hanger plates and one of the lower hanger plates are configured to have a first remote radio unit mounted and secured thereto, and the other upper hanger plate and lower hanger plate are configured to configured to have a second remote radio unit mounted and secured thereto.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim and/or file any new claim, accordingly, including the right to be able to amend any originally filed claim to depend from and/or incorporate any feature of any other claim or claims although not originally claimed in that manner. These and other objects and/or aspects of the present invention are explained in detail in the specification set forth below. Further features, advantages and details of the present invention will be appreciated by those of ordinary skill in the art from a reading of the figures and the

BRIEF DESCRIPTION OF THE DRAWINGS

FIGS. 7A-7C are perspective views that illustrate the ability for the remote radio unit mount assembly of the present invention to be used with different exemplary types of remote radio units according to embodiments of the present invention.

DETAILED DESCRIPTION

Figure 1:
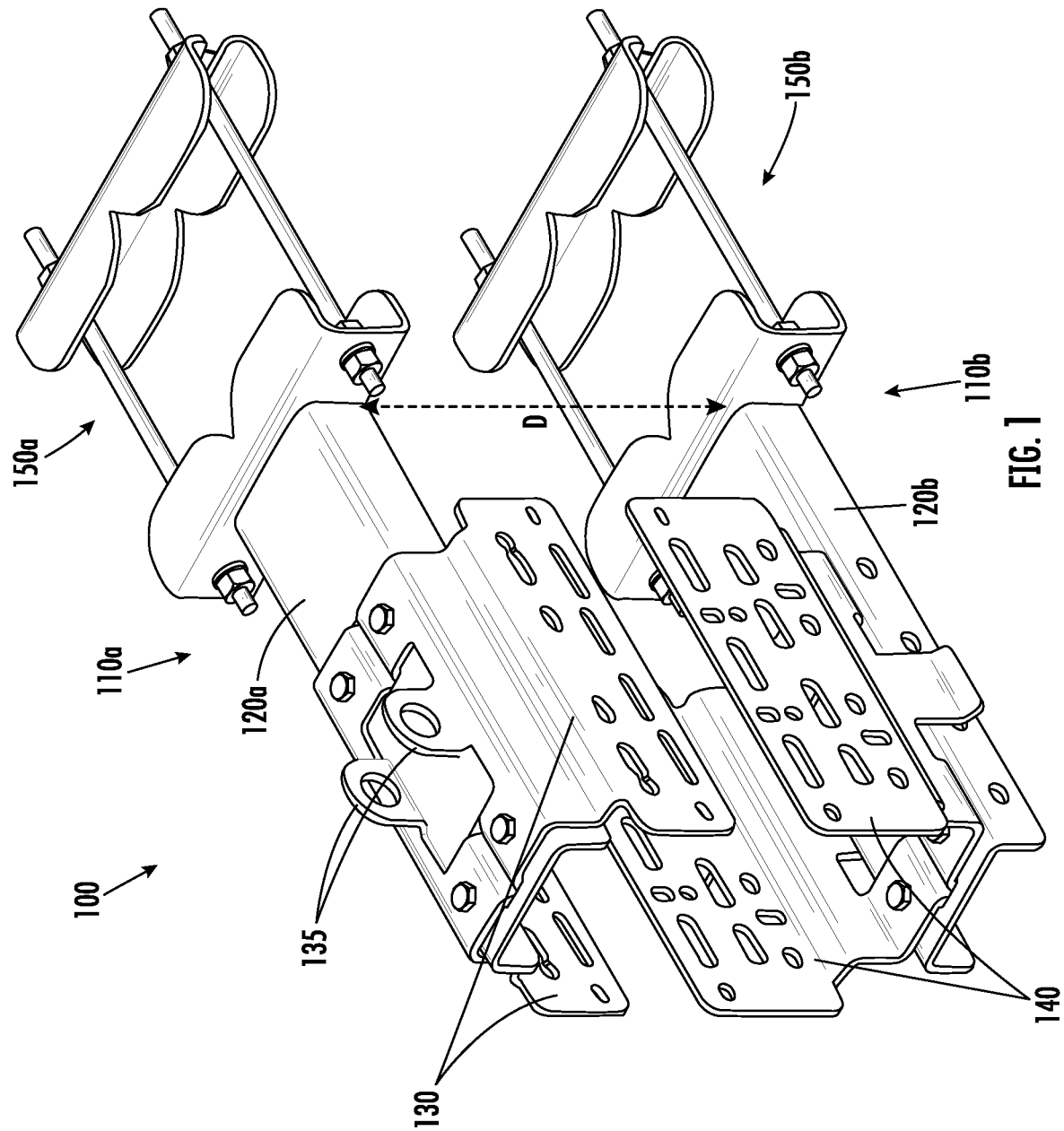
FIG. 1 is a top perspective view of a remote radio unit mount assembly according to embodiments of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the figures, certain layers, components, or features may be exaggerated for clarity, and broken lines illustrate optional features or operations unless specified otherwise. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer, or section. Thus, a first element, component, region, layer, or section discussed below could be termed a second element, component, region, layer or section without departing from the teachings of the present invention. The sequence of operations (or steps) is not limited to the order presented in the claims or figures unless specifically indicated otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Embodiments of the present invention are directed to a universal mount for remote radio units. The universal mount and corresponding assembly are light weight, thereby providing for a simpler and easier installation process compared to other available mounts, as well as being less expensive. Embodiments of the present invention will now be described in further detail below with reference to FIGS. 1-7C.

Referring to FIG. 1, a remote radio unit (RRU) mount assembly 100 according to embodiments of the present invention is illustrated. The assembly 100 of the present invention is configured for mounting one or more remote radio units 50 to a mounting structure 60 (see, e.g., FIG. 6). The RRU mount assembly 100 includes an upper mounting bracket assembly 110a (see also, e.g., FIG. 2A) and a lower mounting bracket assembly 110b (see also, e.g., FIG. 2B) having corresponding clamp assemblies 150a, 150b, which will be described in further detail below. According to embodiments of the present invention, the distance (D) between the upper mounting bracket assembly 110a and the lower mounting bracket assembly 110b may be adjustable to accommodate different types/sizes of remote radio units 50 (see, e.g., FIGS. 7A-7C), for example, when the RRU mount assembly 100 is secured to a mounting structure 60 via clamp assemblies 150a, 150b (see, e.g., FIG. 6).

Figure 2A:
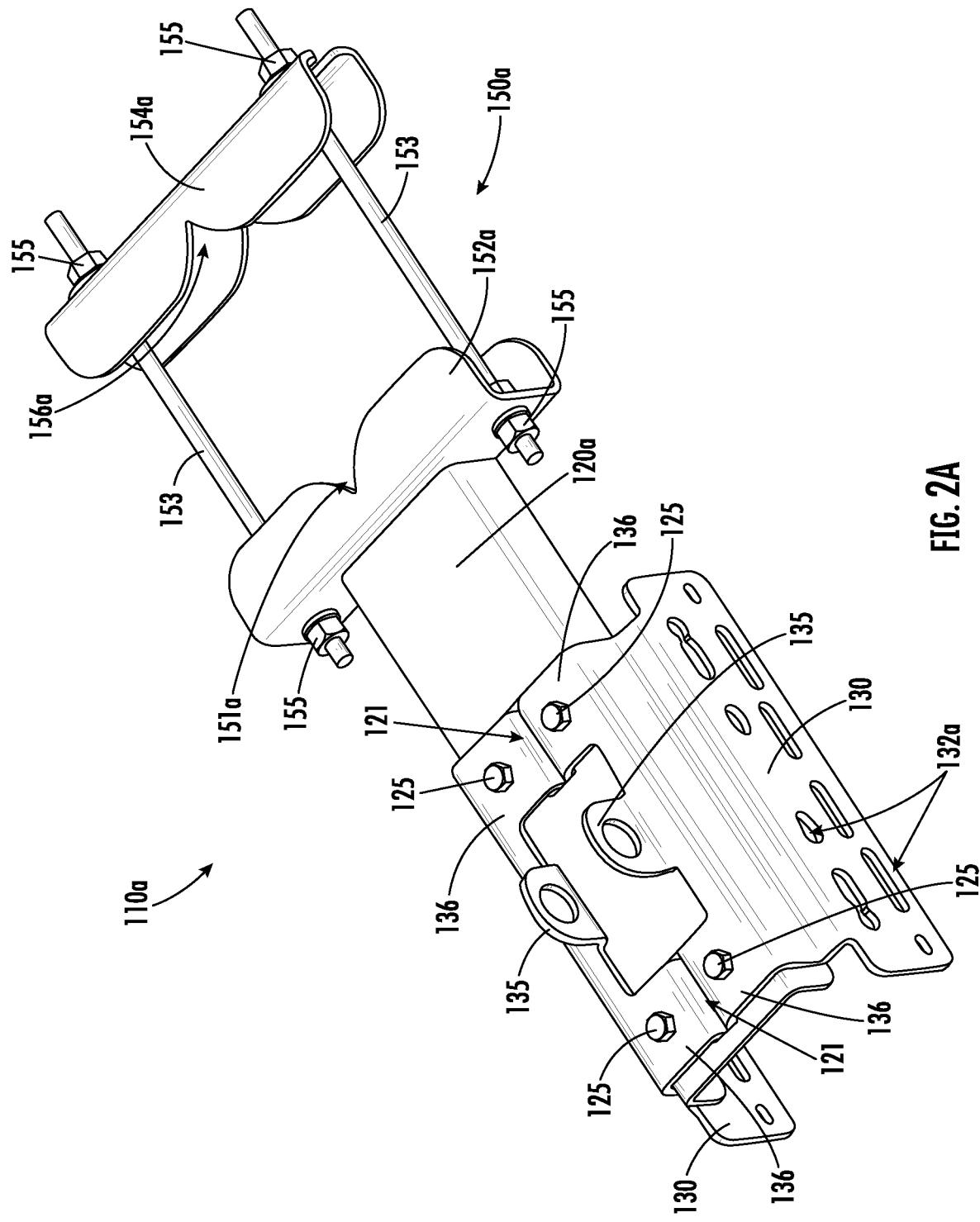
FIG. 2A is a top perspective view of the upper mounting bracket assembly for the remote radio unit mount assembly of FIG. 1.

Referring to FIG. 2A, the upper mounting bracket assembly 110a for the RRU mount assembly 100 is illustrated therein. As shown in FIG. 2A, the upper mounting bracket 110a includes a main support member 120a coupled or secured to an upper clamp assembly 150a. The upper clamp assembly 150a includes front and rear clamping members 152a, 154a which are held together by two threaded bolts or rods 153 and secured with nuts 155. Tightening of the bolts 153 enables the clamping members 152a, 154a to clamp onto a mounting structure 60 such as the leg of an antenna tower, with the mounting structure 60 being held between recesses 151a, 156a in the clamping members 152a, 154a (see, e.g., FIG. 6).

Figure 4:
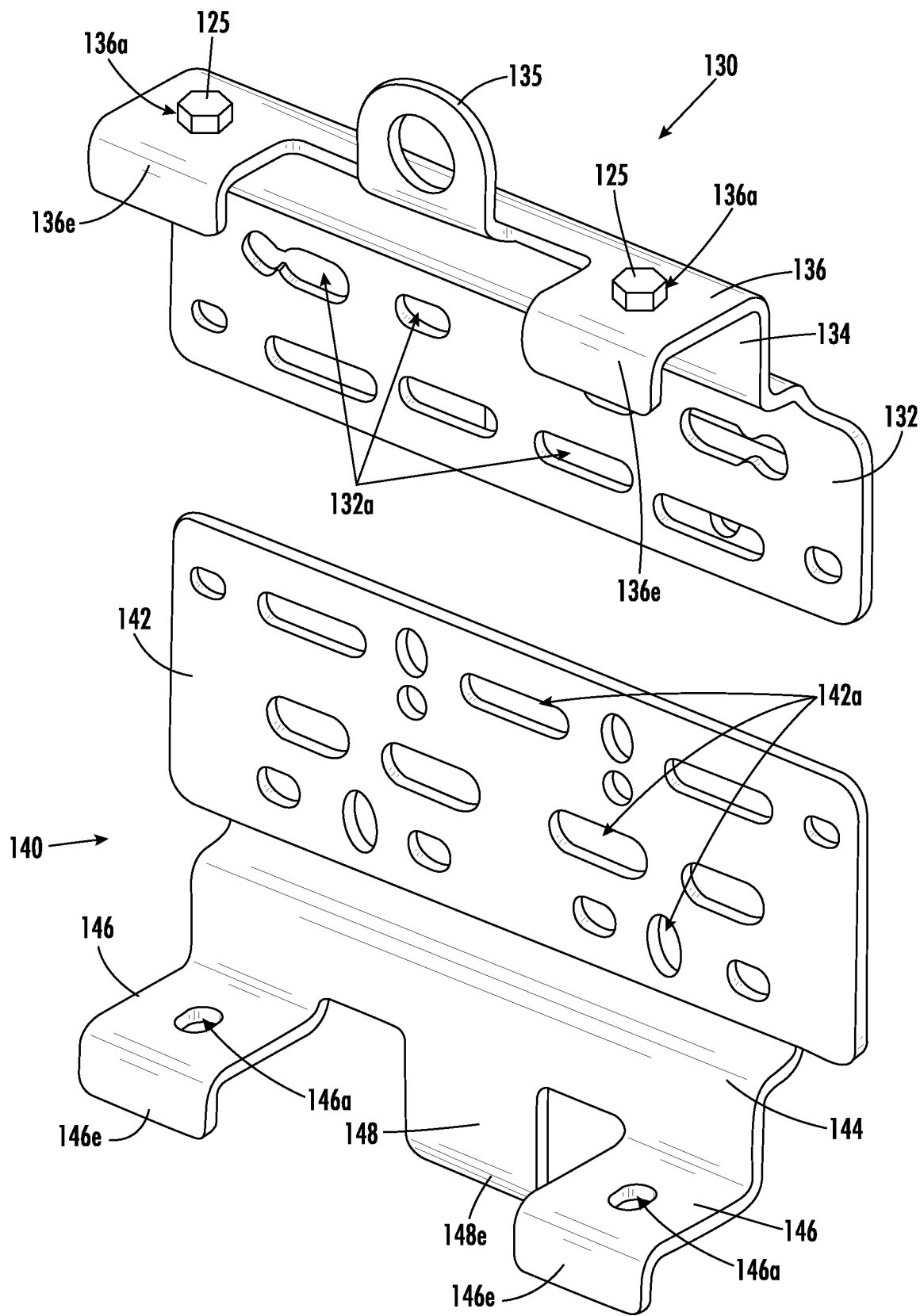
FIG. 4 is a perspective view of a pair of upper and lower hanger plates for the remote radio unit mount assembly of FIG. 1 according to embodiments of the present invention.
Figure 5:
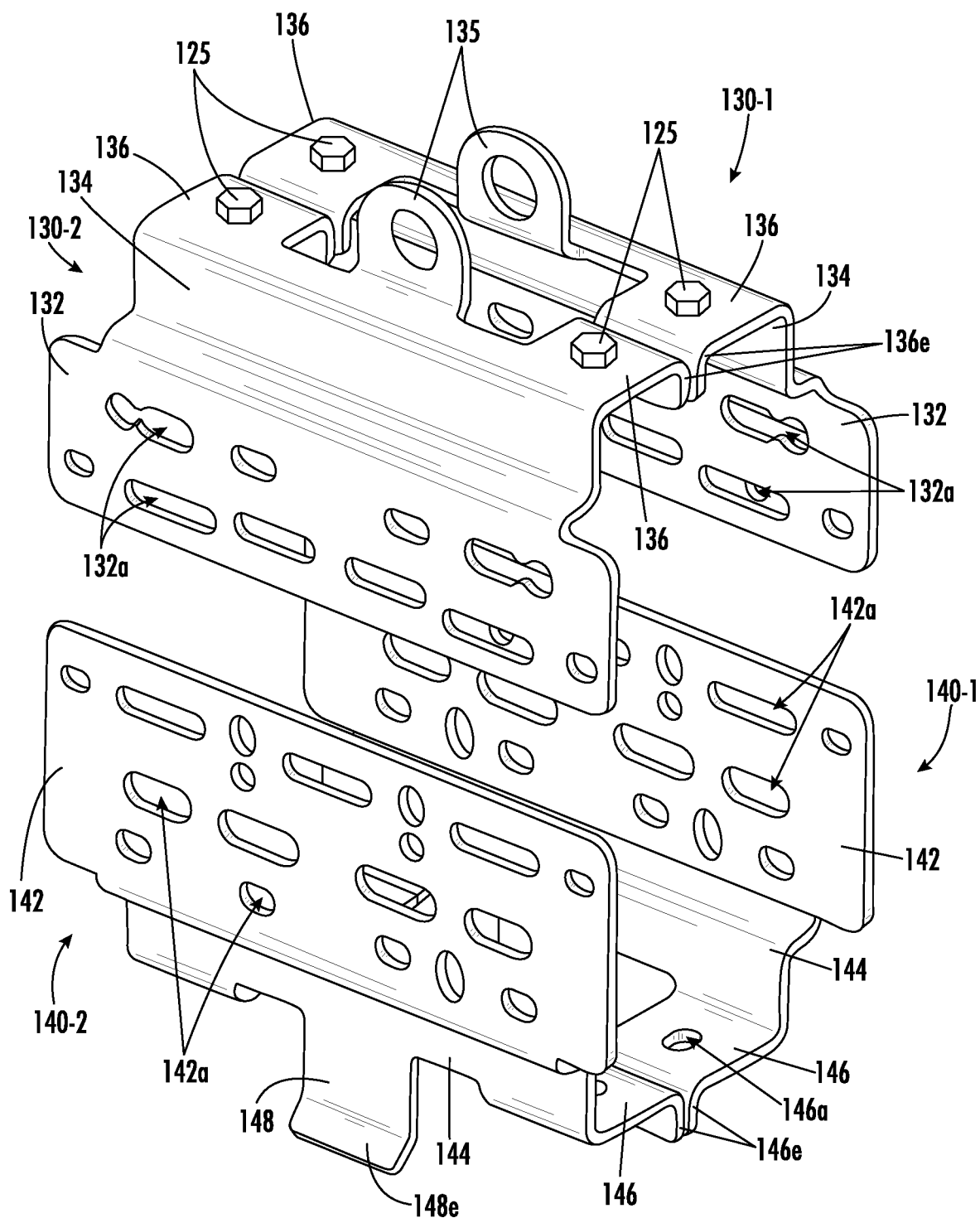
FIG. 5 is a perspective view of opposing pairs of upper and lower hanger plates for the remote radio unit mount assembly of FIG. 1 according to embodiments of the present invention.

As shown in FIG. 2A, the upper mounting bracket assembly 110a further includes a pair of upper hanger plates 130 (see also, e.g., FIG. 5, wherein the upper hanger plates are identified as 130-1 and 130-2). The upper hanger plates 130 are configured to have an RRU 50 mounted and secured thereto (see, e.g., FIG. 6 and FIGS. 7A-7C). As shown in FIG. 2A and FIGS. 4 and 5, each upper hanger plate 130 has a main body 132 comprising a plurality of apertures 132a. Each aperture 132a is configured to receive a respective fastener 55 to secure an RRU 50 to the respective upper hanger plate 130 (see, e.g., FIG. 6). In some embodiments, the apertures 132a may have different shapes and sizes (see, e.g., FIG. 2A and FIGS. 4-5) which allow different types of RRUs 50 to be mounted and secured to the upper mounting bracket assembly 110a (see, e.g., FIGS. 7A-7C). For example, exemplary shapes the apertures 132a may be formed include, but are not limited to, round, elongated, oblong, slotted, and scalloped.

Each upper hanger plate 130 further comprises a mounting section 134 coupled to the main body 132 and extending upwardly therefrom. The mounting section 134 comprises a pair of hooking members 136 that extend outwardly and generally perpendicularly from the mounting section 134 (see, e.g., FIG. 4). As shown in FIG. 4, each hooking member 136 has a flanged edge 136e. As described in further detail below, the flanged edges 136e of each hooking member 136 are configured to engage with the main support member 120a to secure the upper hanger plate 130 to the main support member 120a of the upper mounting bracket assembly 110a. Each hooking member 136 comprises an aperture 136a. Each aperture 136a is configured to receive a respective fastener 125 to further secure the upper hanger plate 130 to the main support member 120a (see, e.g., FIG. 2A).

In addition, as shown in FIG. 2A, FIG. 4, and FIG. 5, in some embodiments, each upper hanger plate 130 may further comprise an eyelet 135 that is coupled to and extends upwardly from the mounting section 134. The eyelet 135 provides a location for a hoisting apparatus or other like device to be secured to the upper hanger plate(s) 130 such that the upper mounting bracket assembly 110a (and lower mounting bracket assembly 110b) may be easily lifted and positioned during installation, particularly when RRUs 50 are secured thereto.

Figure 2B:
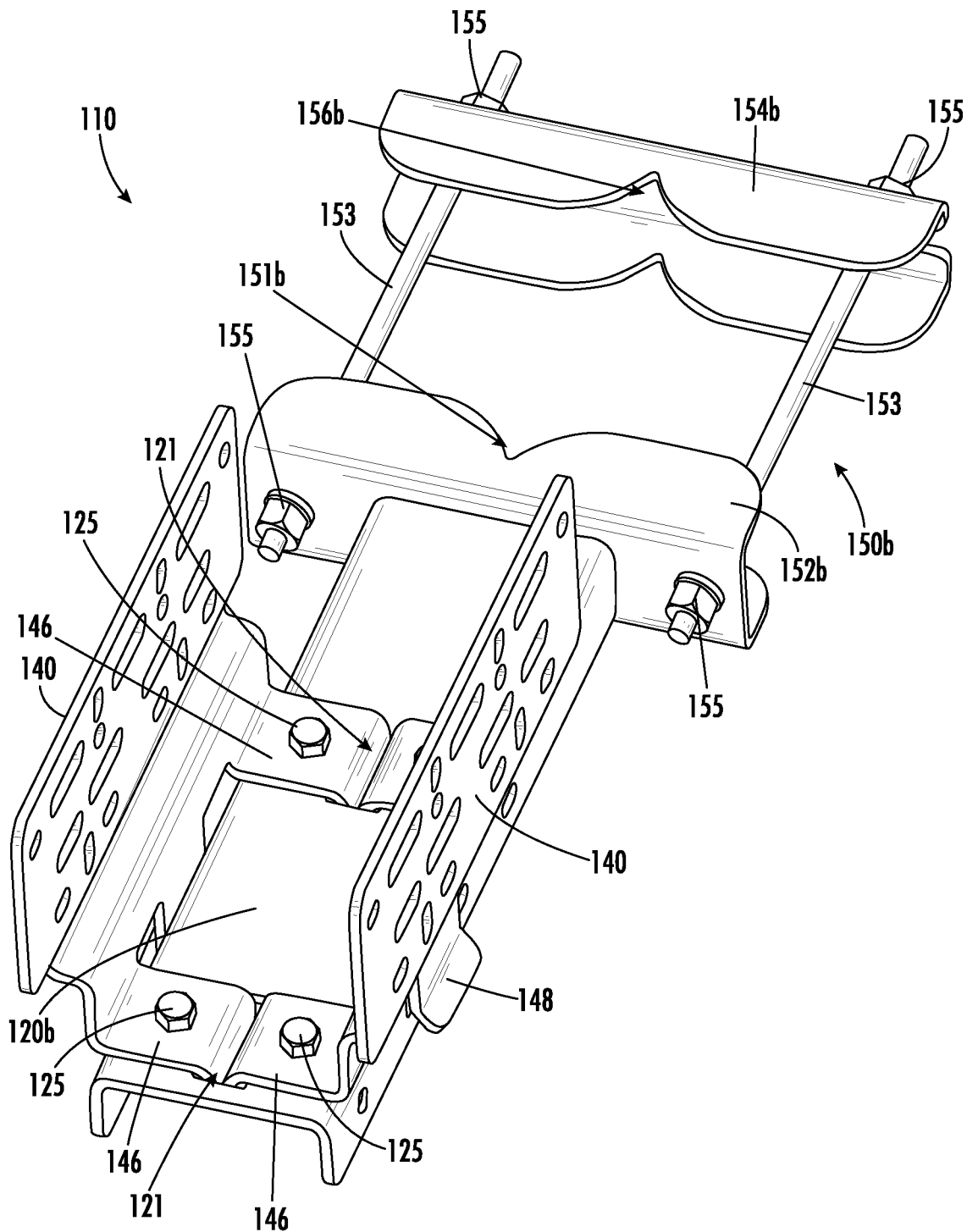
FIG. 2B is a top perspective view of the lower mounting bracket assembly for the remote radio unit mount assembly of FIG. 1.

Referring to FIG. 2B, the lower mounting bracket assembly 110b for the RRU mount assembly 100 is illustrated. Similar to the upper mounting bracket assembly 110a shown in FIG. 2B, the lower mounting bracket 110b includes a main support member 120b coupled or secured to a lower clamp assembly 150b. The lower clamp assembly 150b is the same or similar to the upper clamp assembly 150a and includes front and rear clamping members 152b, 154b which are held together by two threaded bolts or rods 153 and secured with nuts 155. Tightening of the bolts 153 enables the clamping members 152b, 154b to clamp onto a mounting structure 60 such as the leg of an antenna tower, with the mounting structure 60 being held between recesses 151b, 156b in the clamping members 152b, 154b (see, e.g., FIG. 6).

As shown in FIG. 2B, the lower mounting bracket assembly 110b further includes a pair of lower hanger plates 140 (see also, e.g., FIG. 5, wherein the upper hanger plates are identified as 140-1 and 140-2). Similar to the upper hanger plates 130, the lower hanger plates 140 are configured to have an RRU 50 mounted and secured thereto (see, e.g., FIG. 6 and FIGS. 7A-7C). As shown in FIG. 2B and FIGS. 4 and 5, each lower hanger plate 140 has a main body 142 comprising a plurality of apertures 142a. Each aperture 142a is configured to receive a respective fastener 55 to secure an RRU 50 to the respective lower hanger plate 140 (see, e.g., FIG. 6). In some embodiments, the apertures 142a may have different shapes and sizes (see, e.g., FIG. 2B and FIGS. 4-5) which allow different types of RRUs 50 to be mounted and secured to the lower mounting bracket assembly 110b (see, e.g., FIGS. 7A-7C). For example, exemplary shapes the apertures 142a may be formed include, but are not limited to, round, elongated, oblong, slotted, and scalloped.

Each lower hanger plate 140 further comprises a mounting section 144 coupled to the main body 142 and extending downwardly therefrom. The mounting section 144 comprises a pair of hooking members 146 that extend outwardly and generally perpendicularly from the mounting section 144 (see, e.g., FIG. 4). As shown in FIG. 4, each hooking member 146 has a flanged edge 146e. As described in further detail below, the flanged edges 146e of each hooking member 146 are configured to engage with the main support member 120b to secure the lower hanger plate 140 to the main support member 120b of the lower mounting bracket assembly 110b. Each hooking member 146 comprises an aperture 146a. Each aperture 146a is configured to receive a respective fastener 125 to further secure the lower hanger plate 140 to the main support member 120b (see, e.g., FIG. 2B).

In addition, as shown in FIG. 4, and FIG. 5, in some embodiments, each lower hanger plate 140 may further comprise a support member 148 coupled to and extending downwardly from the mounting section 144. The support member 148 may help position the lower hanger plate 140 onto the main support member 120b and also provide structural support when the lower hanger plate 140 is engaged with the main support member 120b. In addition, the support member 148 may also help position and/or provide additional support to a RRU 50 secured to the lower hanger plate 140.

Figure 3:
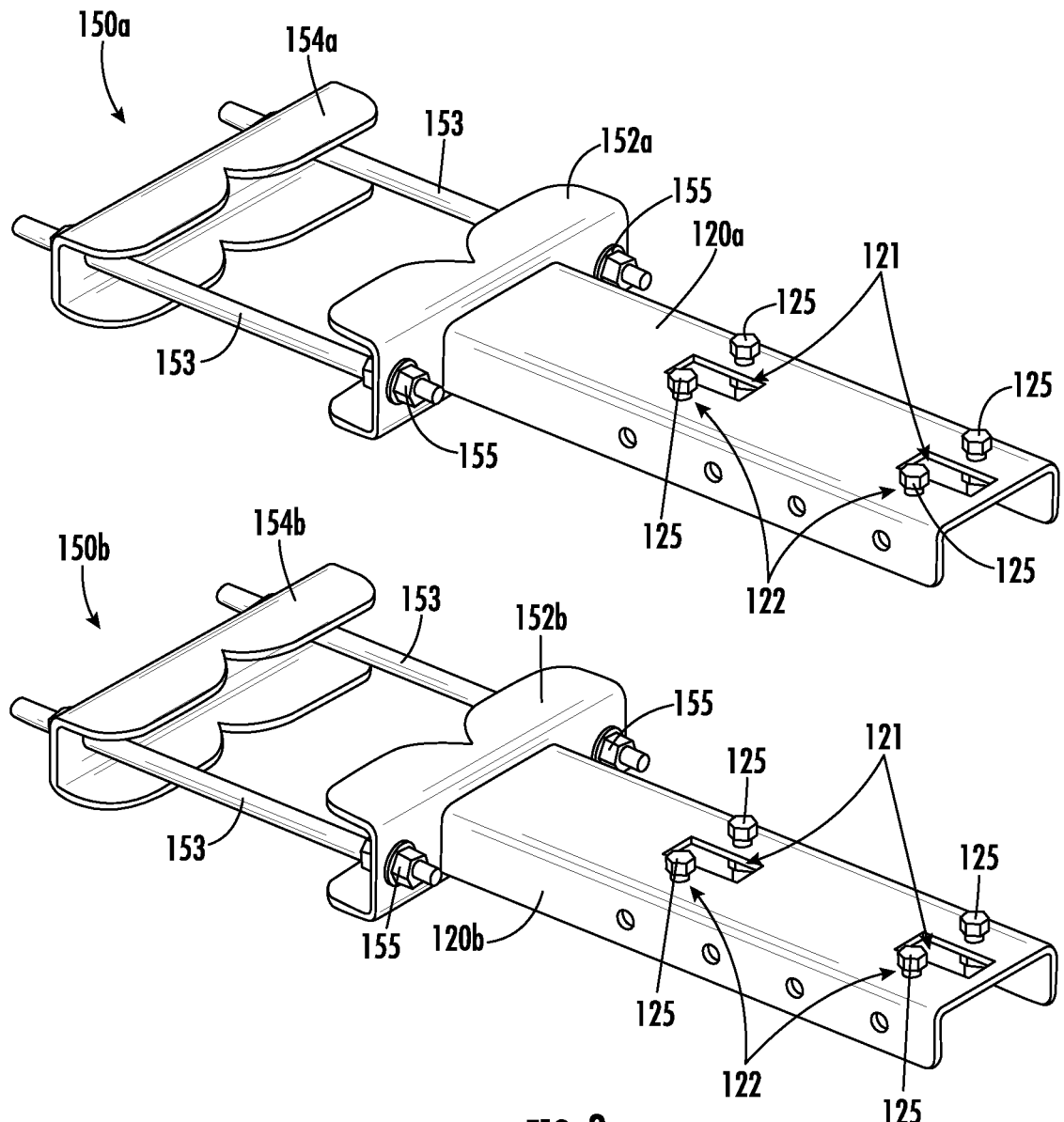
FIG. 3 is a perspective view of the clamp assembly for the remote radio unit mount assembly of FIG. 1 according to embodiments of the present invention.

Referring now to FIG. 3, the clamping assemblies 150a, 150b and main support members 120a, 120b of the RRU mount assembly 100 are illustrated. As shown in FIG. 3, each of the main support members 120a, 120b include a pair of slots 121. The slots 121 extend along a longitudinal axis of each of the main support members 120a, 120b. Each of the slots 121 is configured to receive a flanged edge 136e, 146e of the hooking members 136, 146 of the respective upper and lower hanger plates 130, 140. For example, as shown in FIG. 2A, the flanged edges 136e of the hooking members 136 for the upper hanger plates 130 are configured to be received within the slots 121 in the main support member 120a of the upper mounting bracket assembly 110a. Similarly, the flanged edges 146e of the hooking members 146 for the lower hanger plates 140 are configured to be received with the slots 121 in the main support member 120b of the lower mounting bracket assembly 110b.

In addition, the main support members 120a, 120b further include apertures 122 located adjacent to each slot 121. Each aperture 122 is configured to receive a fastener 125. When the flanged edges 136e, 146e of the hooking members 136, 146 are received with in the slots 121 of the main support members 120a, 120b, the apertures 136a, 146a in the hooking members 136, 146 align with the apertures 122 in the main support members 120a, 120b. As shown in FIG. 2A and FIG. 2B, fasteners 125 may be received by the apertures 136a, 146a of the hooking members 136, 146 and the aligned corresponding apertures 122 in the main support members 120a, 120b to secure the upper and lower hanger plates 130, 140 to the respective main support members 120a, 120b of the upper and lower mounting bracket assemblies 110a, 110b.

Figure 6:
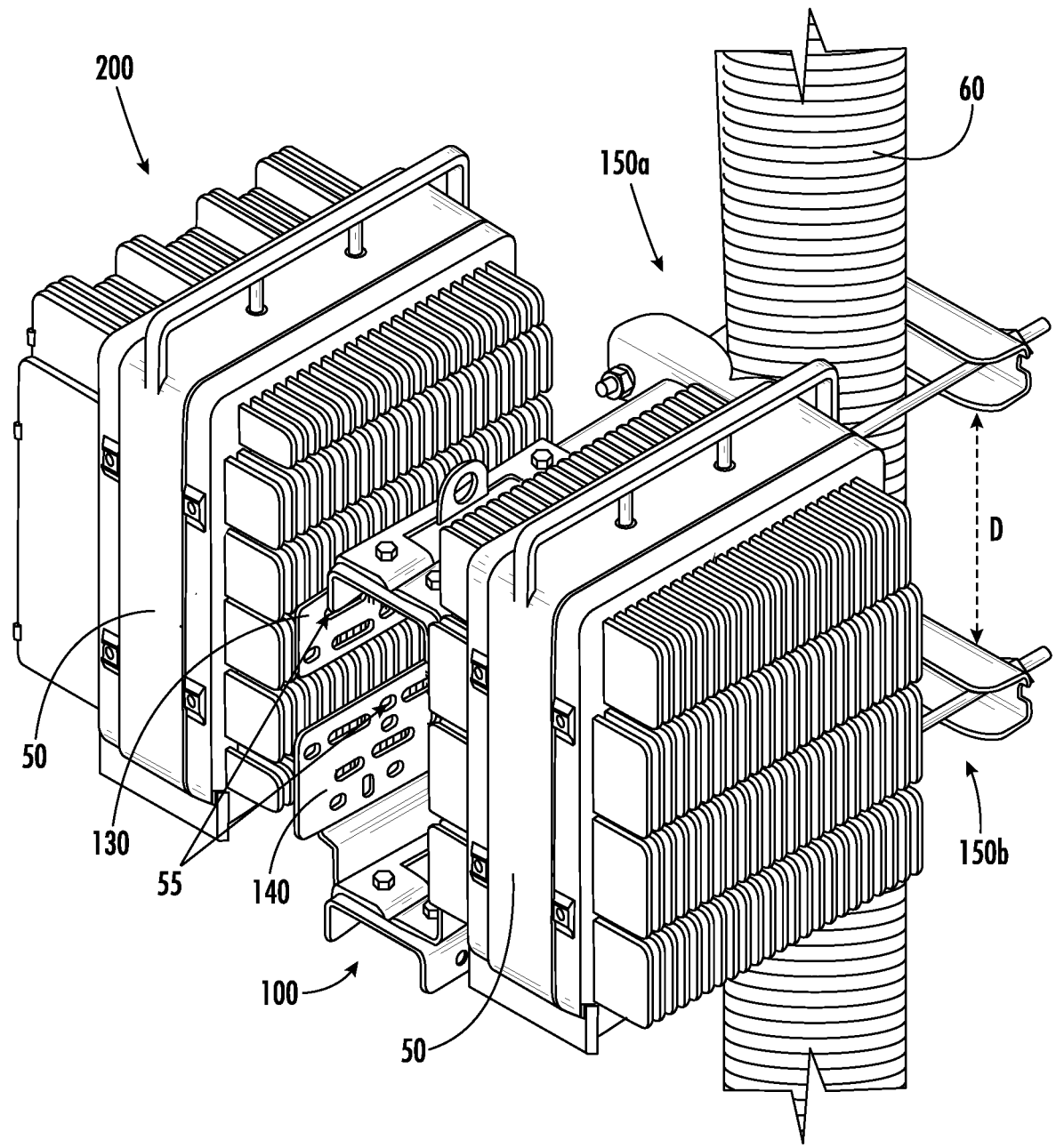
FIG. 6 is a perspective view of an exemplary remote radio unit mount assembly system according to embodiments of the present invention.

FIG. 6 illustrates an exemplary remote radio unit mount assembly system 200 according to embodiments of the present invention. As shown in FIG. 6, a pair of remote radio units 50 are mounted to a mounting structure 60 (e.g., a mounting pole or leg of an antenna tower) utilizing the RRU mount assembly 100 of the present invention.

To install and mount the remote radio units 50 to the mounting structure 60, first the clamping assemblies 150a, 150b (and corresponding main support members 120a, 120b) are mounted and secured to the mounting structure 60. As shown in FIG. 3, and described above, the main support members 120a, 120b are coupled or secured to the respective clamping assemblies 150a, 150b. The clamping assemblies 150a, 150b are positioned a predetermined distance (D) apart from each other on the mounting structure 60. The predetermined distance (D) is based on the type and/or size of remote radio units 50 to be mounted/installed on the mounting structure 60.

Next, each remote radio unit 50 is secured to an upper hanger plate 130 and a lower hanger plate 140 via fasteners 55 (i.e., inserted through corresponding apertures 132a, 142a in the upper and lower hanger plates 130, 140). To lift the remote radio units 50 for installation on the main support members 120a, 120b of the RRU mount assembly 100, a hoisting apparatus or like device may then be secured to one or both eyelets 135 of the upper hanger plates 130. Note that one remote radio unit 50 may be lifted at a time (via the eyelet 135 of the respective upper hanger plate 130) or both remote radio units 50 may be lifted at the same time (via both eyelets 135 of the upper hanger plate 130). The hooking members 136, 146 of the hanger plates 130, 140 are positioned onto the respective main support members 120a, 120b such that the corresponding flanged edges 136e, 146e of the hooking members 136, 146 are received by the slots 121 in the main support members 120a, 120b. In some embodiments, the support members 148 of the lower hanger plates 140 help position the lower hanger plate 140 on the main support member 120b of the lower mounting bracket assembly 110b.

After the flanged edges 136e, 146e are received by the respective slots 121 in the main support members 120a, 120b, the upper and lower hanger plates 130, 140 may be secured to the main support members 120, 130 via fasteners 125 received through apertures 136a, 146a in the hooking members 136, 146 and apertures 122 in the main support members 120a, 120b, and thereby securing the pair of remote radio units 50 to the mounting structure 60 via the RRU mount assembly 100.

Figure 7C:
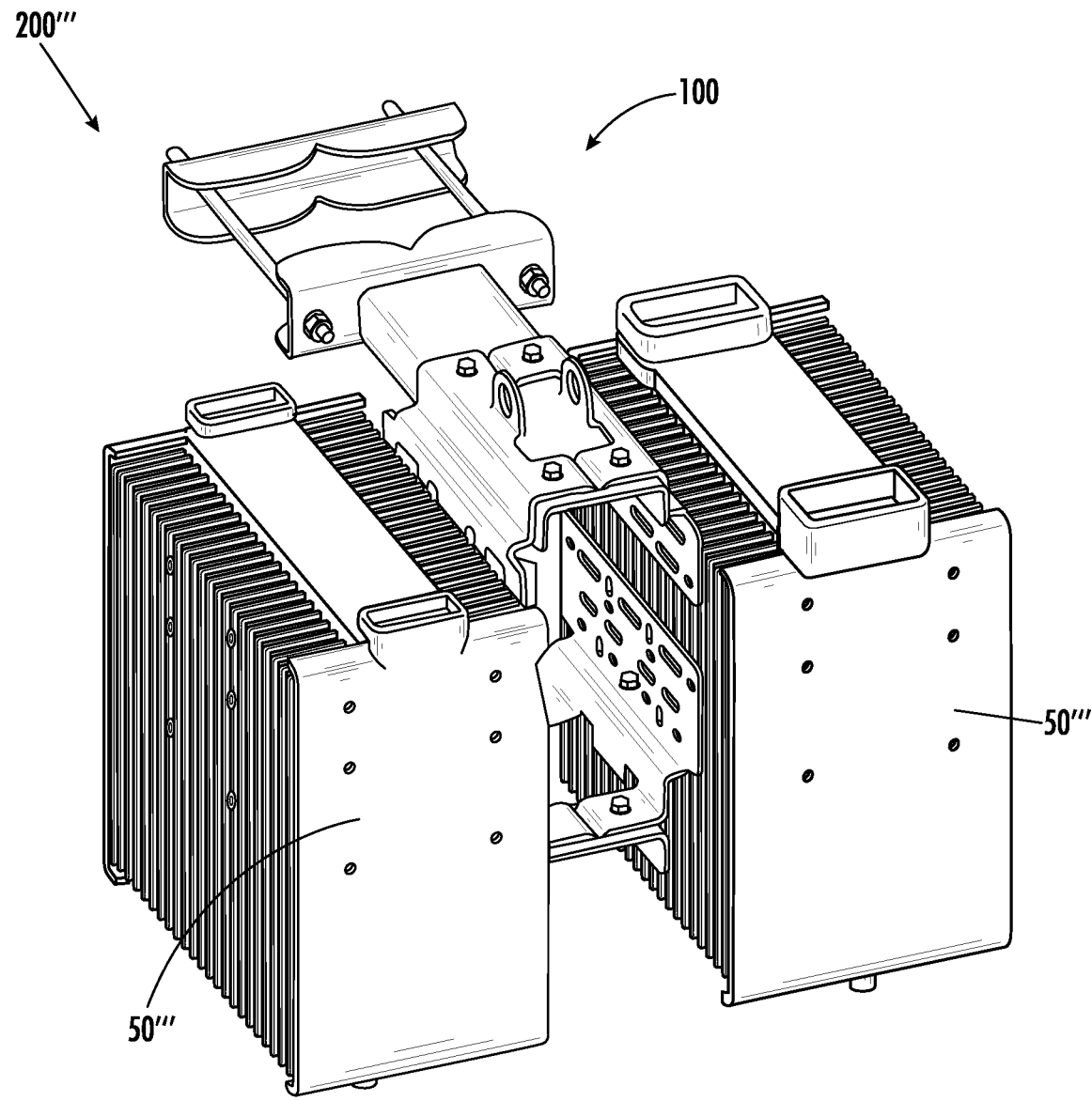

As noted above, the distance (D) between the upper mounting bracket assembly 110a and the lower mounting bracket assembly 110b of the RRU mount assembly 100 of the present invention may be adjustable to accommodate different types/sizes of remote radio units 50. FIGS. 7A-7C show other exemplary remote radio unit mount assembly system 200', 200", 200''' illustrating the ability for the RRU mount assembly 100 of the present invention to be used with different types of remote radio units 50. Exemplary types of remote radio units that may be used with the RRU mount assembly 100 of the present invention include, but are not limited to, Ericsson remote radio units (Part Nos. MTM-RRU-ERC-8863, MTM-RRU-ERC-8843 and MTM-RRU-ERC-4449); Nokia remote radio units (Part Nos. MTM-RRU-NOK-AHLBBA, MTM-RRU-NOK-AHLBA, and MTM-RRU-NOK-AHFIB); and Samsung remote radio units (Part Nos. MTM-RRU-SAM-RFV01U-DIA, MTM-RRU-SAM-FRV01U-D2A, MTM-RRU-SAM-RF4402D-DIA, MTM-RRU-SAM-RF440D-13A, and MTM-RRU-SAM-RF4439D-25A).

In addition, at shown in FIGS. 7A-7C, the RRU mount assembly 100 of the present invention may also allow for the remote radio units 50 to be mounted with the same configuration on both sides of the assembly 100 (see e.g., FIG. 7A) or with different configurations on both sides of the assembly 100 (see, e.g., FIGS. 7B-7C).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

What is claimed is:

1. An assembly for mounting one or more remote radio units to a mounting structure, the assembly comprising:
   an upper mounting bracket assembly, the upper mounting bracket assembly comprising:
   a first main support member coupled to, and extending outwardly from and orthogonally to, a first clamp assembly, the first clamp assembly configured to be secured to the mounting structure; and
   a pair of upper hanger plates, each upper hanger plate is secured to the first main support member; and
   a lower mounting bracket assembly, the lower mounting bracket assembly comprising:
   a second main support member coupled to, and extending outwardly from and orthogonally to, a second clamp assembly, the second clamp assembly configured to be secured to the mounting structure a distance from the first clamp assembly; and a pair of lower hanger plates, each lower hanger plate is secured to the second main support member, wherein one of the upper hanger plates and one of the lower hanger plates are configured to have a first remote radio unit mounted and secured thereto, and wherein the other upper hanger plate and lower hanger plate are configured to configured to have a second remote radio unit mounted and secured thereto.

2. The assembly according to claim 1, wherein the distance between the first clamp assembly and the second clamp assembly is adjustable to accommodate different types and/or sizes of the first and second remote radio units.

3. The assembly according to claim 1, wherein the first and second clamp assemblies each comprise a front clamping member and a rear clamping member held together by two threaded bolts or rods and secured with nuts.

4. The assembly according to claim 1, wherein each of the upper hanger plates have a main body comprising a plurality of apertures, each aperture configured to receive a respective fastener to secure the first or second remote radio unit thereto, and wherein each of the upper hanger plates further comprise a mounting section coupled to and extending upwardly from the main body, the mounting section including a pair of hooking members extending outwardly and generally perpendicularly from the mounting section, each of the hooking members having a flanged edge configured to engage with the first main support member.

5. The assembly according to claim 1, wherein each upper hanger plate comprises an eyelet.

6. The assembly according to claim 1, wherein each of the lower hanger plates have a main body comprising a plurality of apertures, each aperture configured to receive a respective fastener to secure the first or second remote radio unit thereto.

7. The assembly according to claim 6, wherein each of the lower hanger plates further comprise a mounting section coupled to and extending downwardly from the main body, the mounting section including a pair of hooking members extending outwardly and generally perpendicularly from the mounting section, each of the hooking members having a flanged edge configured to engage with the second main support member.

8. The assembly according to claim 6, wherein each lower hanger plate further comprises a support member configured to help position each lower hanger plate onto the second main support member.

9. The assembly according to claim 1, wherein the first and second main support members each comprise a pair of slots which extend along a longitudinal axis of each respective main support member, each slot configured to receive a portion of the respective upper and lower hanger plates.

10. A mounted remote radio unit pair, the pair comprising:
a first remote radio unit and a second remote radio unit; and
the assembly defined in claim 1, wherein the first and second remote radio units are mounted, respectively, to the upper and lower mounting bracket assemblies.

11. A remote radio unit mount assembly system, the system comprising:
a first remote radio unit and a second remote radio unit; and
a remote radio unit mount assembly, the mount assembly comprising:
an upper mounting bracket assembly, the upper mounting bracket assembly comprising:
a first main support member coupled to, and extending outwardly from and orthogonally to, a first clamp assembly, the first clamp assembly configured to be secured to a mounting structure; and
a pair of upper hanger plates, each upper hanger plate is secured to the first main support member; and
a lower mounting bracket assembly, the lower mounting bracket assembly comprising:
a second main support member coupled to, and extending outwardly from and orthogonally to, a second clamp assembly, the second clamp assembly configured to be secured to the mounting structure a distance from the first clamp assembly; and
a pair of lower hanger plates, each lower hanger plate is secured to the second main support member,
wherein the first remote radio unit is mounted and secured to one of the upper hanger plates and one of the lower hanger plates, and wherein the second remote radio unit is mounted and secured to the other upper hanger plate and lower hanger plate.

12. The assembly according to claim 11, wherein the distance between the first clamp assembly and the second clamp assembly is adjustable to accommodate different types and/or sizes of the first and second remote radio units.

13. The assembly according to claim 11, wherein the first and second clamp assemblies each comprise a front clamping member and a rear clamping member held together by two threaded bolts or rods and secured with nuts.

14. The assembly according to claim 11, wherein each of the upper hanger plates comprise:
a main body having a plurality of apertures, each aperture configured to receive a respective fastener to secure the first or second remote radio unit thereto;
a mounting section coupled to and extending upwardly from the main body, the mounting section including a pair of hooking members extending outwardly and generally perpendicularly from the mounting section, each of the hooking members having a flanged edge configured to engage with the first main support member; and
an eyelet coupled to and extending upwardly from the mounting section.

15. The assembly according to claim 11, wherein each of the lower hanger plates comprise:
a main body having a plurality of apertures, each aperture configured to receive a respective fastener to secure the first or second remote radio unit thereto;
a mounting section coupled to and extending downwardly from the main body, the mounting section including a pair of hooking members extending outwardly and generally perpendicularly from the mounting section, each of the hooking members having a flanged edge configured to engage with the second main support member; and
a support member coupled to and extending downwardly from the mounting section.

16. The assembly according to claim 11, wherein the first and second main support members each comprise a pair of slots which extend along a longitudinal axis of each respective main support member, each slot configured to receive a portion of the respective upper and lower hanger plates.

17. An assembly for mounting one or more remote radio units to a mounting structure, the assembly comprising:
an upper mounting bracket assembly, the upper mounting bracket assembly comprising:

a first main support member secured to, and not detachable from, a first clamp assembly, the first clamp assembly configured to be secured to the mounting structure; and a pair of upper hanger plates, each upper hanger plate is secured to the first main support member, wherein each of the upper hanger plates comprise:

a main body having a plurality of apertures, each aperture configured to receive a respective fastener to secure the first or second remote radio unit thereto;

a mounting section coupled to and extending upwardly from the main body, the mounting section including a pair of hooking members extending outwardly and generally perpendicularly from the mounting section, each of the hooking members having a flanged edge configured to engage with the first main support member; and an eyelet coupled to and extending upwardly from the mounting section; and a lower mounting bracket assembly, the lower mounting bracket assembly comprising:

a second main support member secured to, and not detachable from, a second clamp assembly, the second clamp assembly configured to be secured to the mounting structure a distance from the first clamp assembly; and a pair of lower hanger plates, each lower hanger plate is secured to the second main support member, wherein each of the lower hanger plates comprise:

a main body having a plurality of apertures, each aperture configured to receive a respective fastener to secure the first or second remote radio unit thereto;

a mounting section coupled to and extending downwardly from the main body, the mounting section including a pair of hooking members extending outwardly and generally perpendicularly from the mounting section, each of the hooking members having a flanged edge configured to engage with the second main support member; and a support member coupled to and extending downwardly from the mounting section wherein one of the upper hanger plates and one of the lower hanger plates are configured to have a first remote radio unit mounted and secured thereto, and wherein the other upper hanger plate and lower hanger plate are configured to configured to have a second remote radio unit mounted and secured thereto.

18. The assembly according to claim 17, wherein the distance between the first clamp assembly and the second clamp assembly is adjustable to accommodate different types and/or sizes of the first and second remote radio units.

19. The assembly according to claim 17, wherein the first and second clamp assemblies each comprise a front clamping member and a rear clamping member held together by two threaded bolts or rods and secured with nuts.

20. The assembly according to claim 17, wherein the first and second main support members each comprise a pair of slots which extend along a longitudinal axis of each respective main support member, each slot configured to receive a portion of the respective upper and lower hanger plates.

* * * * *